(12) United States Patent
Tanaka

(10) Patent No.: US 7,737,494 B2
(45) Date of Patent: Jun. 15, 2010

(54) SEMICONDUCTOR DEVICE AND MANUFACTURING METHOD THEREOF

(75) Inventor: Hiroyuki Tanaka, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/232,439

(22) Filed: Sep. 17, 2008

(65) Prior Publication Data

US 2009/0114987 A1    May 7, 2009

(30) Foreign Application Priority Data

Nov. 7, 2007    (JP)    ............................ 2007-290195

(51) Int. Cl.
*H01L 29/76* (2006.01)
(52) U.S. Cl. ...................... 257/335; 257/336; 257/330; 257/339; 257/340; 257/409; 438/140; 438/454
(58) Field of Classification Search ......... 257/339–340, 257/409, 330, 335–336, E29.256; 438/140, 438/454
See application file for complete search history.

(56) References Cited

U.S. PATENT DOCUMENTS

2007/0063271 A1 * 3/2007 Takimoto et al. ............ 257/330

2008/0067588 A1 * 3/2008 Williams et al. ............ 257/343

FOREIGN PATENT DOCUMENTS

JP    2007-067181    3/2007

OTHER PUBLICATIONS

Kawaguchi et al., 0.6 μm BiCMOS Based 15 and 25V LDMOS for Analog Applications, 2001, Proceedings of 2001 International Symposium on Power Semiconductor Devices & IC, pp. 169-172, Osaka.

* cited by examiner

*Primary Examiner*—Theresa T Doan
(74) *Attorney, Agent, or Firm*—Rabin & Berdo, PC

(57) ABSTRACT

A semiconductor device includes a semiconductor layer with an impurity of a first conductivity type diffused therein, and a local insulating layer, source layer, and a drain layer formed therein. The drain layer has an impurity of a second conductivity type opposite to the first conductivity type. A gate electrode is formed over the semiconductor layer extending from over the local insulating layer to the source layer. A low-concentration diffusion layer is formed in the semiconductor layer below the drain layer. First and second gate insulating films are formed between the gate electrode and the semiconductor layer, and respectively extending from an end, on the source layer side, of the gate electrode to the local insulating layer without reaching the local insulating layer, and extending from an end on another side of the local insulting layer to the source layer.

10 Claims, 6 Drawing Sheets

SEMICONDUCTOR DEVICE AND MANUFACTURING METHOD THEREOF

BACKGROUND OF THE INVENTION

The present invention relates to a semiconductor device such as a lateral double diffusion MOS transistor or the like that needs a high breakdown voltage and low power consumption, and a manufacturing method thereof.

In a conventional lateral double diffusion MOS (Metal Oxide Semiconductor) transistor (called "LDMOS"), an N-type LDMOS is formed which includes a local insulating layer comprised of silicon oxide, which is formed in an N well layer formed by diffusing an N-type impurity into a P-type semiconductor substrate in a low concentration, a drain layer formed by diffusing an N-type impurity into the N well layer lying in a region adjacent to one side of the local insulating layer in a high concentration, a P body diffusion layer formed by diffusing a P-type impurity into the N well layer lying in a region separated from the other side of the local insulating layer in a low concentration, a source layer formed by diffusing an N-type impurity into the P body diffusion layer in a high concentration, a gate electrode formed over the N well layer lying in a region extending from over the local insulating layer to the source layer, a first gate insulating film formed between the gate electrode and the N well layer, and a second gate insulating film, which is formed in a region adjacent to the other side of the local insulating layer and which is connected to the first gate insulating film and thicker than the first gate insulating film and thinner than the local insulating layer. An end on the source layer side, of the second gate insulating film thick in thickness is caused to approach the P body diffusion layer in a range in which they do not overlap, and the length of a drift drain region is substantially increased by the local insulating layer formed in the N well layer, thereby enhancing a source-to-drain breakdown voltage (refer to, for example, a patent document 1 (Japanese Unexamined Patent Publication No. 2007-67181 (mainly paragraph 0019 in page 6—paragraph 0047 in page 8 and FIGS. 3A and 4)).

With a body diffusion layer formed below the source layer and a semiconductor layer provided therearound as different conductivity-type diffusion layers, such an LDMOS enhances a source-to-drain breakdown voltage at an OFF state of the gate electrode by a depletion layer which expands the semiconductor layer from a PN junction formed in the boundary therebetween to the drain layer. There has however been proposed an LDMOS (called "resurf LDMOS") wherein in order to further enhance the source-to-drain breakdown voltage, a conductivity-type drift diffusion layer different from the semiconductor layer is formed below the drain layer, and the PN junction formed in the boundary to the semiconductor layer lying therearound, and the drain layer are caused to approach therebetween thereby to facilitate the formation of a depletion layer that expands the drift diffusion layer from the PN junction to the drain layer, thus making it possible to enhance a source-to-drain breakdown voltage (refer to, for example, a non-patent document 1 (Y. Kawagutchi et al., [0.6 µm BiCMOS Based 15 and 25V LDMOS for an Analog Application], Proc. 2001 int. Symp. Power Semiconductor Devices & ICs, p. 169)).

The above-described resurf LDMOS has an advantage in that when the differences in concentration for forming the PN junctions between the resurf LDMOS and the LDMOS described in the patent document 1 are made identical, the source-to-drain breakdown voltage (hereinafter called simply "breakdown voltage") at the OFF state of the gate electrode can be brought to a higher breakdown voltage as compared with the LDMOS described in the patent document 1. If this advantage is utilized, then the diffusion concentration of the drift diffusion layer is set to a higher concentration in the case of the same breakdown voltage to more reduce an ON resistance, thereby making it possible to attain a further reduction in power consumption. The present situation is however that a practicable resurf LDMOS has not been realized.

This is because when the gate insulating film lying below the gate electrode is set to a normal thickness for operating the resurf LDMOS, the concentration of an electric field becomes easier to occur directly below the end on the source layer side, of the local insulating layer in the drift diffusion layer, and obtaining a predetermined ON resistance at a predetermined breakdown voltage becomes difficult.

SUMMARY OF THE INVENTION

With the foregoing in view, the present invention aims to provide means for realizing a practicable resurf LDMOS (semiconductor device) capable of obtaining a predetermined ON resistance at a predetermined breakdown voltage.

According to one aspect of the invention, for attaining the above object, there is provided a semiconductor device comprising:

a semiconductor layer with an impurity of a first conductivity type diffused therein;

a local insulating layer formed in the semiconductor layer;

a drain layer formed in the semiconductor layer located on one side of the local insulating layer with an impurity of a second conductivity type opposite to the first conductivity type being diffused therein;

a source layer formed in the semiconductor layer separated from the other side of the local insulating layer with the second conductivity type impurity being diffused therein;

a gate electrode formed over the semiconductor layer extending from over the local insulating layer to the source layer;

a low-concentration diffusion layer formed in the semiconductor layer located below the drain layer, the local insulating layer and the gate electrode with the second conductivity type impurity being diffused therein in a concentration lower than the drain layer;

a first gate insulating film formed between the gate electrode and the semiconductor layer and extending from an end on the source layer side, of the gate electrode to the local insulating layer without reaching the local insulating layer; and a second gate insulating film formed between the gate electrode and the semiconductor layer and extending from an end on the other side of the local insulting layer to the source layer, the second gate insulating film being connected to the first gate insulating film and being thicker than the first gate insulating film and thinner than one-half of the thickness of the local insulating layer.

Thus, the present invention obtains advantageous effects in that a stepwise point of change in shape can be formed at a portion on a low-concentration diffusion layer where a first gate insulating film and a second gate insulating film are connected, and a higher breakdown voltage can be ensured by dispersing the concentration of an electric field developed in the point of change in shape stepwise and relaxing the concentration of an electric field developed in the point of change in the shape of an end on the source side, of a local insulating layer, thus making it possible to realize a practicable resurf LDMOS capable of obtaining a predetermined ON resistance at a predetermined breakdown voltage.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a semiconductor device according to the present invention and its manufacturing method will hereinafter be described with reference to the accompanying drawings.

Figure 1:
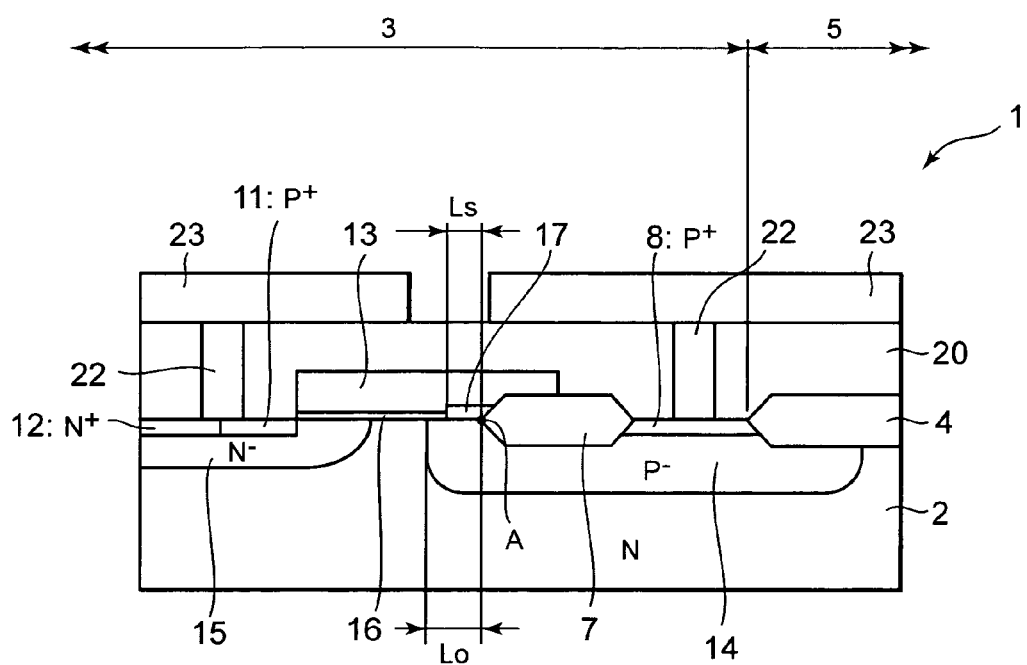
FIG. 1 is an explanatory diagram showing a section of a semiconductor device according to an embodiment.
Figure 2:
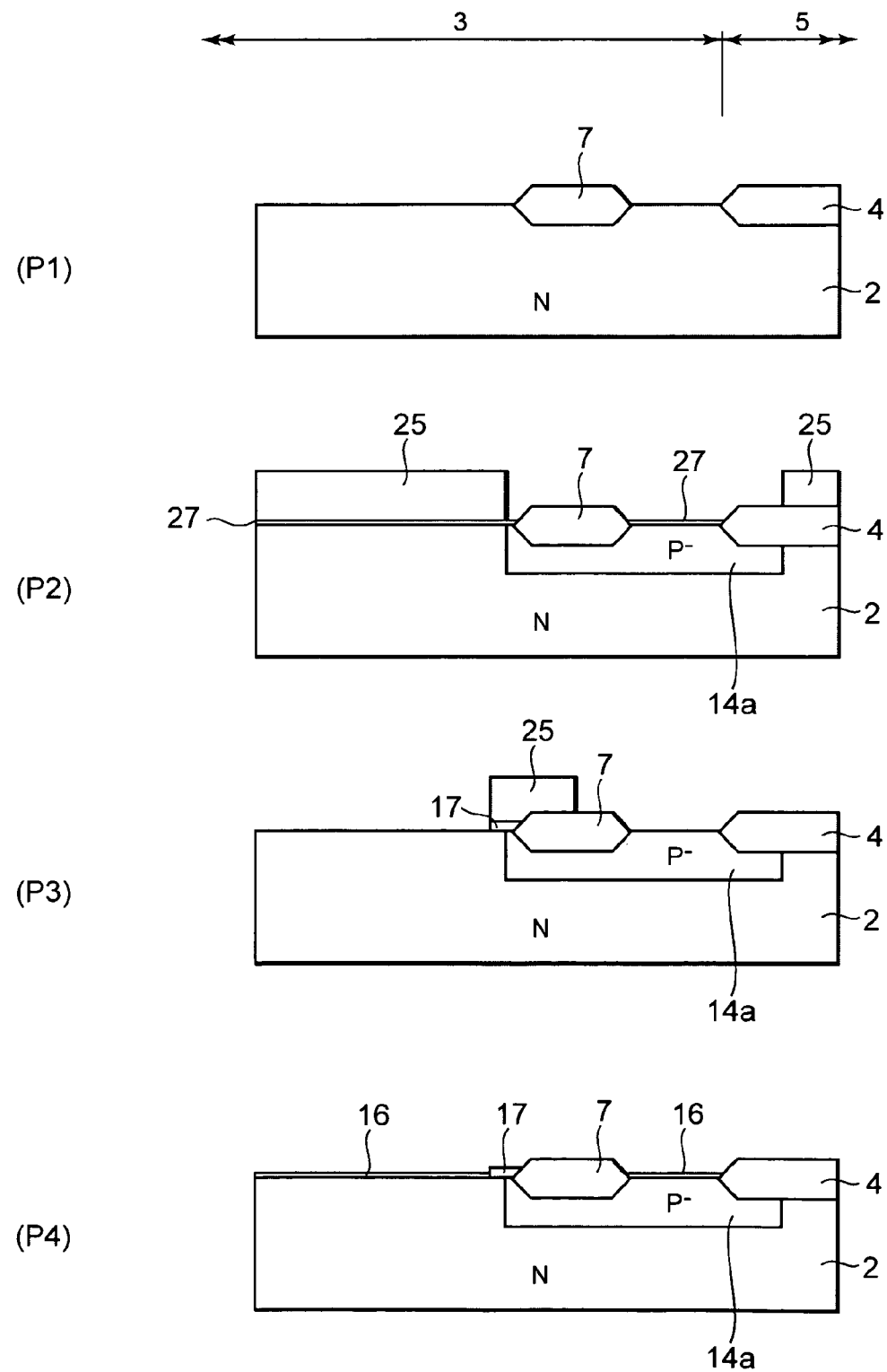
FIG. 2 is an explanatory diagram illustrating a method for manufacturing the semiconductor device according to the embodiment.
Figure 3:
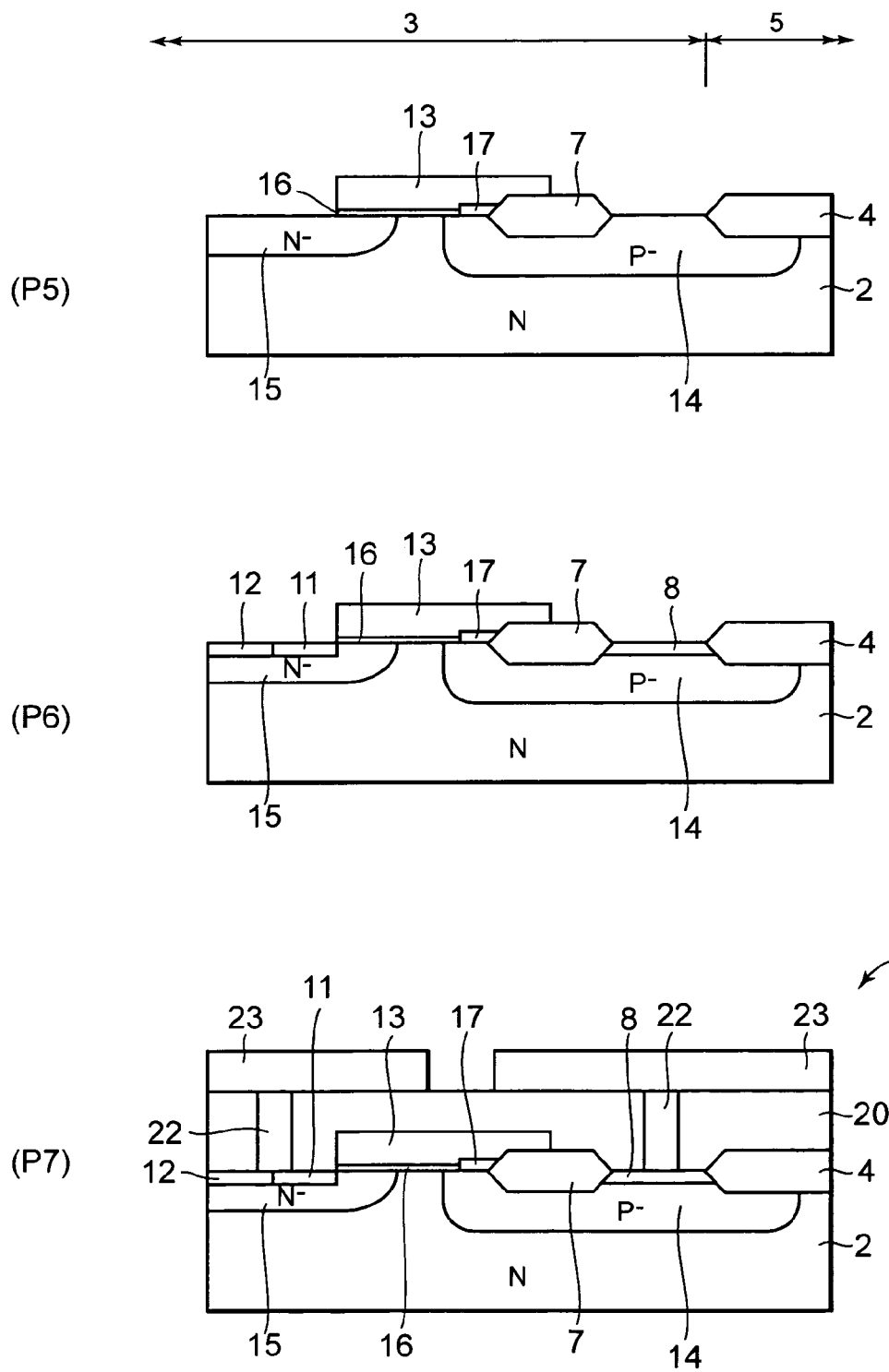
FIG. 3 is an explanatory diagram showing the method for manufacturing the semiconductor device according to the embodiment.

FIG. 1 is an explanatory diagram showing a section of a semiconductor device according to an embodiment, and FIGS. 2 and 3 are respectively explanatory diagrams showing a method for manufacturing the semiconductor device according to the embodiment.

In FIG. 1, reference numeral 1 indicates a resurf LDMOS used as the semiconductor device. In the present embodiment, a P-type resurf LDMOS is used.

Reference numeral 2 indicates a silicon substrate used as a semiconductor layer, which is formed by diffusing an N-type impurity such as phosphorous (P), arsenic (As) or the like corresponding to a first conductivity-type impurity of the present embodiment into a substrate comprised of silicon (Si) in a relatively low concentration (hereinafter called "N-type silicon substrate 2").

A device forming region or area 3 for forming the resurf LDMOS 1 and a device isolation region or area 5 for forming a device isolation layer 4 that surrounds the periphery of the device forming area 3 are formed on the N-type silicon substrate 2 employed in the present embodiment.

The device isolation layer 4 is formed of an insulating material such as silicon oxide ($SiO_2$) or the like in the device isolation area 5 of the N-type silicon substrate 2 and has the function of electrically insulating and isolating between the adjoining device forming areas 3 of the N-type silicon substrate 2.

Reference numeral 7 indicates a local insulating layer, which is of an insulating layer formed with the same insulating material as the device isolation layer 4 and the same thickness as the device isolation layer 4 at a position separated from the device isolation layer 4, which is lying inside the device isolation layer 4 that surrounds the device forming area 3 of the N-type silicon substrate 2.

Reference numeral 8 indicates a drain layer, which is of a diffusion layer formed by diffusing a P-type impurity such as boron (B) of type opposite to an N type corresponding to a second conductivity type impurity employed in the present embodiment into the N-type silicon substrate 2 lying in a region between one side of the local insulating layer 7 and the device isolation layer 4, in a high concentration.

Reference numeral 11 indicates a source layer, which is of a diffusion layer formed by diffusing a P-type impurity into a surface layer of the device forming area 3 of the N-type silicon substrate 2, which is separated from the other side of the local insulating layer 7, in a high concentration.

Reference numeral 12 indicates an N+ diffusion layer used as a pullout layer, which is of a diffusion layer formed by diffusing the N-type impurity into a surface layer lying in a region adjacent to the source layer 11 in a high concentration.

Reference numeral 13 indicates a gate electrode, which is of an electrode comprised of an electrode material such as polycrystalline silicon or the like containing the N-type impurity in a relatively high concentration. The corresponding electrode is formed on the N-type silicon substrate 2 lying in a region extending from above the local insulating layer 7 to the end of the source layer 11 and disposed opposed to the N-type silicon substrate 2.

Reference numeral 14 indicates a drift diffusion layer used as a low-concentration diffusion layer, which is of a diffusion layer (hereinafter called "P drift diffusion layer 14") formed in the N-type silicon substrate 2 located below the drain layer 8, the local insulating layer 7 and the gate electrode 13 by diffusing, by heat treatment or annealing, a P-type impurity of a low-concentration implantation layer 14a (refer to FIG. 4 and the like and hereinafter called "P low concentration implantation layer 14a") formed by implanting the P-type impurity into the N-type silicon substrate 2 between one side of the local insulating layer 7 and the device isolation layer 4 and the N-type silicon substrate 2 lying in a region adjacent to the other side of the local insulating layer 7 in a concentration lower than the drain layer 8. This is formed so as to extend to a region up to a position spaced a distance Lo (called "offset length Lo") from the other side of the local insulating layer 7, i.e., an end A on the source layer 11 side after the above diffusion.

Reference numeral 15 indicates a body diffusion layer, which is of a diffusion layer (hereinafter called "N body diffusion layer 15") formed by diffusing the N-type impurity into the device forming area 3 of the N-type silicon substrate 2 lying in the region spaced away from the P drift diffusion layer 14 extended to the other side of the local insulating layer 7 in a concentration higher than the N-type silicon substrate 2 and in a concentration lower than the N+ diffusion layer 12. The body diffusion layer 15 is formed so as to surround the source layer 11 and the N+ diffusion layer 12.

Reference numeral 16 indicates a first gate insulating film relatively thin in thickness, which is of an insulating film that extends from the end A on the source layer 11 side of the gate electrode 13 to the local insulating layer 7 between the gate electrode 13 and the N-type silicon substrate 2 without reaching the local insulating layer 7 and which is formed of the insulating material such as silicon oxide and has the original thickness (15 nm or so in the present embodiment) for operating the resurf LDMOS 1.

Reference numeral 17 indicates a second gate insulating film. The second gate insulating film is of an insulating film which extends from the end on the other side of the local insulating layer 7 to the source layer 11 between the gate electrode 13 and the N-type silicon substrate 2 and which is connected to the first gate insulating film 16 and formed of the same material as the first gate insulating film 16 and with a thickness (50 nm or so in the present embodiment) thicker than the first gate insulating film 16 and thinner than one-half of the thickness of the local insulating layer 7. This is formed in a region up to a position spaced a distance Ls (called "step length Ls") from the end A on the source layer 11 side of the local insulating layer 7 above the P drift diffusion layer 14 formed on the source layer 11 side.

A channel of the resurf LDMOS 1 having the above configuration is formed in the N body diffusion layer 15 opposite to the gate electrode 13 with the first gate insulating film 16 interpose therebetween and the surface layer of the N-type silicon substrate 2.

Reference numeral 20 indicates an interlayer insulating film, which is of an insulating film formed of the insulating material such as silicon oxide, which covers the resurf LDMOS 1 formed on the N-type silicon substrate 2.

Reference numerals 22 indicate contact plugs, which are of conductive plugs formed by embedding a conductive material such as tungsten (W), aluminium (Al) or the like into contact holes opened as through holes, respectively, which penetrate the interlayer insulating film 20 and thereby extend to the drain layer 8 and a boundary portion between the source layer 11 and the N+ diffusion layer 12 in the resurf LDMOS 1.

Reference numerals 23 indicate metal wirings, which are of wirings formed by patterning a metal conductive layer comprised of the conductive material such as tungsten, aluminium or the like, which is formed on the interlayer insulating film 20. The metal wirings 23 are electrically connected to the contact plugs 22 respectively.

In FIG. 2, reference numeral 25 indicates a resist mask used as a mask member. It is of a mask pattern formed by subjecting a positive or negative resist applied onto the N-type silicon substrate 2 by photolithography to exposure and development processing. The resist mask functions as a mask for etching and ion implantation in the present embodiment.

A method for manufacturing the semiconductor device according to the present embodiment will be explained below in accordance with process steps indicated by P in FIGS. 2 and 3.

At P1 (FIG. 2), an N-type silicon substrate 2 in which an N-type impurity is diffused in a low concentration and device forming areas 3 and device separation or isolation areas 5 are set, is prepared. A pad oxide film having a thin thickness is formed on the N-type silicon substrate 2 by a thermal oxidation method. A silicon nitride film comprised of silicon nitride ($Si_3N_4$) is formed on the pad oxide film by a CVD (Chemical Vapor Deposition) method. A resist mask 25 (not shown), which covers the corresponding device forming area 3 excluding an area or region for forming a local insulating layer 7, i.e., exposes the corresponding device isolation area 5 and the forming area of the local insulating layer 7, is formed on the silicon nitride film by photolithography.

With the formed resist mask 25 as a mask, the silicon nitride film is eliminated or removed by anisotropic etching to expose the pad oxide film. With the exposed silicon nitride film as a mask after the removal of the resist mask 25, the N-type silicon substrate 2 in the device isolation area 5 is oxidized by a LOCOS (Local Oxidation Of Silicon) method to form a device separation or isolation layer 4 and a local insulating layer 7 each having a thickness of 450 nm or so. The silicon nitride film and the pad oxide film are removed by wet etching.

Figure 4:
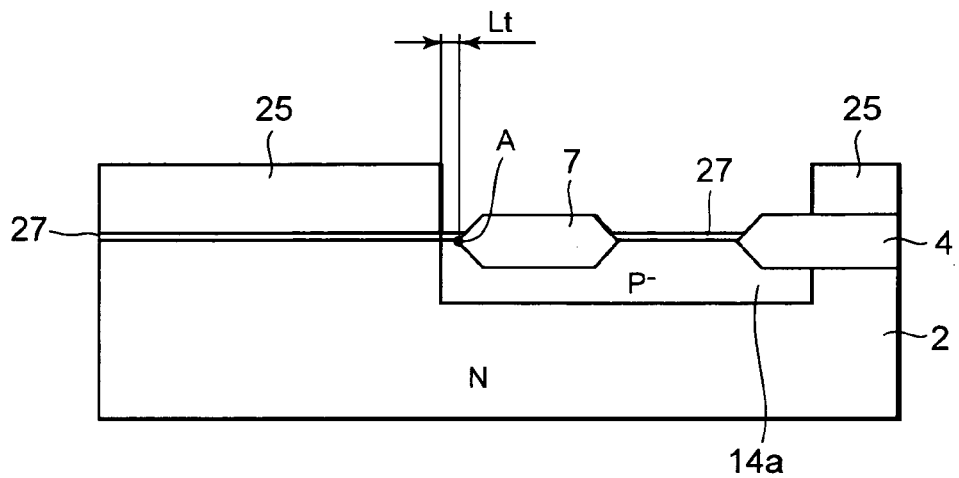
FIG. 4 is an explanatory diagram illustrating an on-implantation offset length in the method for manufacturing the semiconductor device according to the embodiment.

At P2 (FIG. 2), the upper surface of the N-type silicon substrate 2 in the device forming area 3 is oxidized by the thermal oxidation method to form a sacrifice oxide film 27 comprised of silicon oxide, having a thickness of 30 nm or so. As shown in FIG. 4, a resist mask 25, which exposes the sacrifice oxide film 27 of the device forming area 3 between the device isolation layer 4 and one side of the local insulting layer 7, and exposes the sacrifice oxide film 27 lying in a region adjacent to the other side of the local insulating layer 7, i.e. a region up to a position spaced a distance Lt (called "on-implantation offset length Lt", and Lt=0.5 μm in the present embodiment) from an end A of the local insulating layer 7 on the forming side of the source layer 11, is formed by photolithography.

With the formed resist mask 25 as a mask, P-type impurity ions (boron in the present embodiment) of $1 \times 10^{13}/cm^2$ are implanted into the N-type silicon substrate 2 located below the exposed sacrifice oxide film 27 to form a P low-concentration implantation layer 14a for forming a P drift diffusion layer 14.

The sacrifice oxide film 27 used in this case is formed to protect the upper surface of the N-type silicon substrate 2 at the ion implantation and keep the flatness of the upper surface and to perform the removal or the like of a residual of the silicon nitride film where the its residual exists.

At P3 (FIG. 2), the sacrifice oxide film 27 is removed by wet etching after the removal of the resist mask 25 formed at the process step P2. The entire upper surface of the N-type silicon substrate 2 is oxidized by the thermal oxidation method to form a second gate insulating film 17 comprised of silicon oxide, having a thickness of 47 nm or so on the upper surface of the N-type silicon substrate 2 of the device forming area 3 lying in a region excluding the device isolation layer 4 and the local insulating film 7. Further, a resist mask 25 is formed by photolithography, which covers over the second gate insulating film above the P low-concentration implantation layer 14a lying in a region adjacent to the other side of the local insulating layer 7, i.e., a region up to a position spaced by a distance (0.8 μm in the present embodiment) at which the amount of reduction by wet etching is expected, from the end A of the local insulating layer 7 on the formed side of the source layer 11. With this resist mask as a mask, the silicon oxide is selectively etched by wet etching using hydrofluoric acid (HF) to eliminate the exposed second gate insulating film 17 and thereby expose the upper surface of the N-type silicon substrate 2, whereby the corresponding second gate insulating film 17 whose end surface is formed at a position spaced a step length Ls (0.7 μm in the present embodiment) from the end A of the local insulating layer 7 is formed.

At P4 (FIG. 2), the resist mask 25 formed at the process step P3 is removed and the upper surface of the N-type silicon substrate 2 is oxidized by the thermal oxidation method to make its connection to the second gate insulating film 17, thereby forming a first gate insulating film 16 of the resurf LDMOS 1, having a thickness of 15 nm or so, which is thinner than the second gate insulating film 17 in thickness and comprised of silicon oxide.

The thickness of the second gate insulating film 17 is grown to 50 nm or so by this thermal oxidation.

At P5 (FIG. 3), polycrystalline silicon containing an N-type impurity (phosphorus in the present embodiment) is deposited over the entire upper surface of the N-type silicon substrate 2 on the first and second gate insulating films 16 and 17 and the like by the CVD method to form an electrode material layer having a thickness of 300 nm or so. A resist mask 25 (not shown), which covers the area or region for forming the gate electrode 13 that extends from over the local insulating layer 7 of the device forming area 3 to the forming region of the source layer 11, is formed on the electrode material layer by photolithography. With the resist mask as a mask, the electrode material layer and the first gate insulating film 16 are eliminated by anisotropic etching to form a gate electrode 13 with the upper surface of the N-type silicon substrate 2 being exposed.

The resist mask 25 is removed and a resist mask 25 (not shown) that has exposed the N-type silicon substrate 2 in a region for forming an N body diffusion layer 15 in the device forming area 3, is formed by photolithography. With this resist mask as a mask, N-type impurity ions (phosphorus in the present embodiment) of $1 \times 10^{13}/cm^2$ are implanted. After the implantation thereof, the implanted N-type impurity ions are diffused by heat treatment at 1050° C. to form the corresponding N body diffusion layer 15 in which the N-type impurity is diffused in a concentration higher than the N-type silicon substrate 2 ($1 \times 10^{18}/cm^3$ in the present embodiment).

At this time, the P-type impurity implanted in the P low-concentration implantation layer 14a is also activated and diffused simultaneously to enlarge the P low-concentration implantation layer 14a, so that a P drift diffusion layer 14 is formed in which an offset length Lo extending from the end A of the local insulating layer 7 is brought to 0.9 μm and the P-type impurity is diffused in a low concentration ($5 \times 10^{17}/cm^3$ in the present embodiment).

Thus, a PN junction between the N-type silicon substrate 2 and the P drift diffusion layer 14 is formed at a position close to the second gate insulating film 17 located directly below the first gate insulating film 16.

The end of the N body diffusion layer 15 on the local insulating layer 7 side is at a position spaced about 1 μm from the end A of the local insulating layer 7.

Incidentally, since it is difficult to actually measure the boundary between the N-type silicon substrate 2 and the P drift diffusion layer 14, 0.4 μm oversize was determined by simulation calculation as to the above offset length Lo.

At P6 (FIG. 3), the resist mask 25 used in the ion implantation at the process step P5 is eliminated, and a resist mask 25 (not shown), which has exposed the P drift diffusion layer 14 (the forming region of the drain layer 8) lying between the device isolation layer 4 of the device forming area 3 and one side of the local insulating layer 7, and the N body diffusion layer 15 in the forming region of the source layer 11 adjacent to the side of the gate electrode 13 opposite to the local insulating layer 7, is formed on the N-type silicon substrate 2 by photolithography. With this as a mask, a P-type impurity (boron in the present embodiment) is implanted to form a drain layer 8 and a source layer 11 in which the P-type impurity is diffused in a concentration higher than the P drift diffusion layer 14.

After the removal of the resist mask 25, a resist mask (not shown), which has exposed the forming region of the N+ diffusion layer 12 adjacent to the source layer 11 for the N body diffusion layer 15, is formed on the N-type silicon substrate 2 by photolithography. With this as a mask, an N-type impurity (arsenic in the present embodiment) is implanted to form an N+ diffusion layer in which the N-type impurity is diffused in a concentration higher than the source layer 11, after which the resist mask 25 is eliminated.

At P7 (FIG. 3), silicon oxide is deposited relatively thick over the entire surfaces on the N-type silicon substrate 2, of the drain layer 8, source layer 11, gate electrode 13 and the like by the CVD method. Their upper surfaces are subjected to planarization processing to form an interlayer insulting film 20.

After the formation of the interlayer insulating film 20, a resist mask 25 (not shown), which has openings that have exposed the boundary between the source layer 11 and the N+ diffusion layer 12 and the interlayer insulating film 20 lying in a region for forming each contact hole at the drain layer 8, is formed on the interlayer insulating film 20 by photolithography. With the resist mask 25 as a mask, the contact holes, which reach the boundary between the source layer 11 and the N+ diffusion layer 12 and the drain layer 8 through the interlayer insulating film 20, are respectively formed by anisotropic etching for selectively etching the silicon oxide. After the removal of the resist mask 25, tungsten is embedded into the contact holes by the CVD method or sputtering method, and their upper surfaces are subjected to planarization processing to expose the upper surface of the interlayer insulating film 20, whereby contact plugs 22 are formed.

Aluminum is deposited on the interlayer insulating film 20 by the sputtering method or the like to form a metal conductive layer for forming each metal wiring 23. A resist mask 25 (not shown), which covers a region for forming each metal wiring 23, is formed by photolithography. With the resist mask 25 as a mask, the metal conductive layer is etched to form each metal wiring 23 electrically connected to its corresponding contact plug 22, thereby forming the resurf LDMOS 1 according to the present embodiment shown in FIG. 1.

In the resurf LDMOS 1 formed in this way, the source layer 11 and the N+ diffusion layer 12 are grounded. The N body diffusion layer is grounded via the N+ diffusion layer 12. If a negative voltage greater than or equal to a threshold voltage is applied to the gate electrode 13 in a state of a negative voltage less than or equal to a predetermined breakdown voltage being applied to the drain layer 8, then the N body diffusion layer 15 and the surface layer of the N-type silicon substrate adjacent to the N body diffusion layer 15 are reversed to form a channel, so that the current flows from the source layer 11 to the drain layer 8. If the application of the voltage to the gate electrode 13 is repeated, then a switching operation is enabled.

When the gate electrode 13 is in an OFF state, a depletion layer extends from the PN junction between the P drift diffusion layer 14 and the N-type silicon substrate 2 to the direction of the drain layer 8, thereby making it possible to relax an electric field and ensure a breakdown voltage.

Since, at this time, the thick second gate insulating film 17 adjacent to the local insulating layer 7 and connected stepwise to the first gate insulating film 16 is formed at the end on the source layer 11 side, of the local insulating layer 7 employed in the present embodiment, the concentration of an electric field developed at a point of change in shape is dispersed stepwise to make it possible to relax the concentration of the electric field developed at the point of change in the shape of the end on the source layer 11 side, of the local insulating layer 7, whereby a higher breakdown voltage can be ensured.

On the other hand, when the gate electrode 13 is in an ON state, a rise in ON resistance is suppressed as a consequence without blocking a current path by the thick second gate insulating film 17.

A predetermined breakdown voltage that the resurf LDMOS 1 manufactured in the above-described manner aims is 20V or higher and a predetermined ON resistance is 80 mΩmm$^2$ or less.

Figure 5:
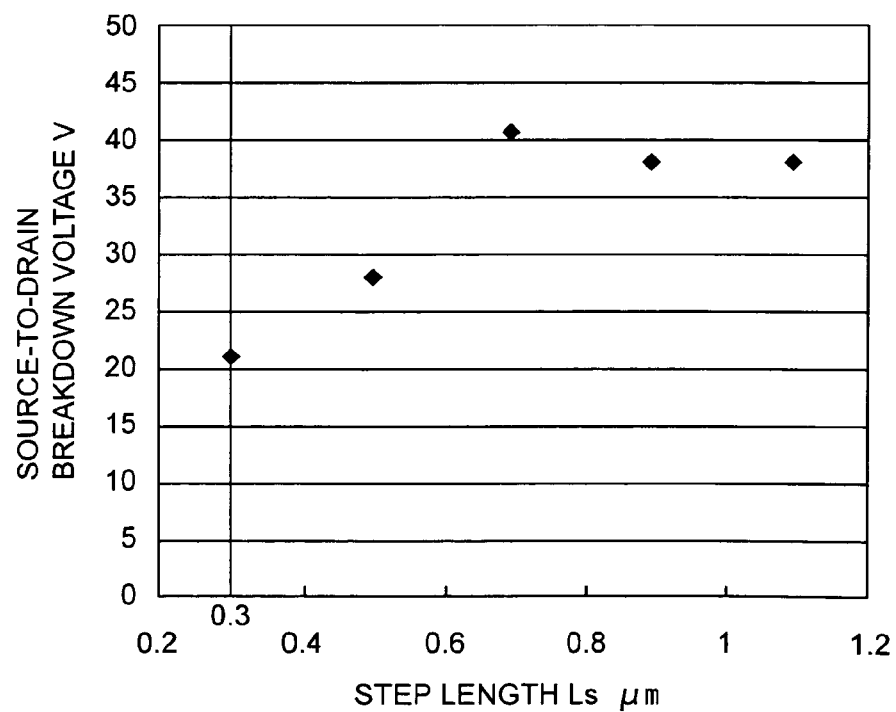
FIG. 5 is a graph showing the dependence of a breakdown voltage of a resurf LDMOS of the embodiment on a step length.
Figure 6:
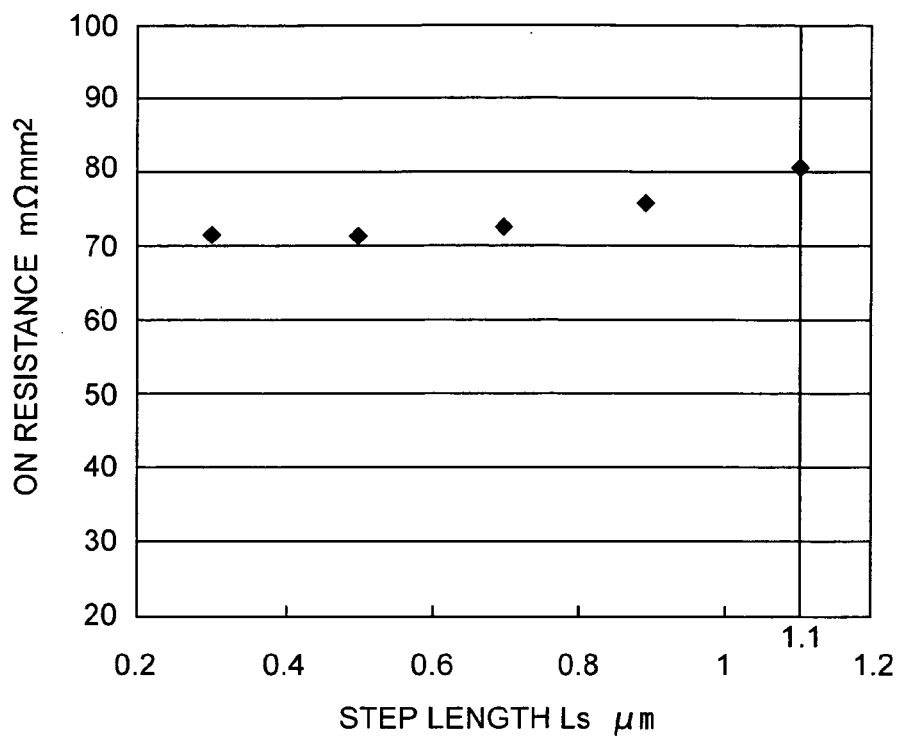
FIG. 6 is a graph illustrating the dependence of ON resistance of the resurf LDMOS of the embodiment on a step length.
Figure 7:
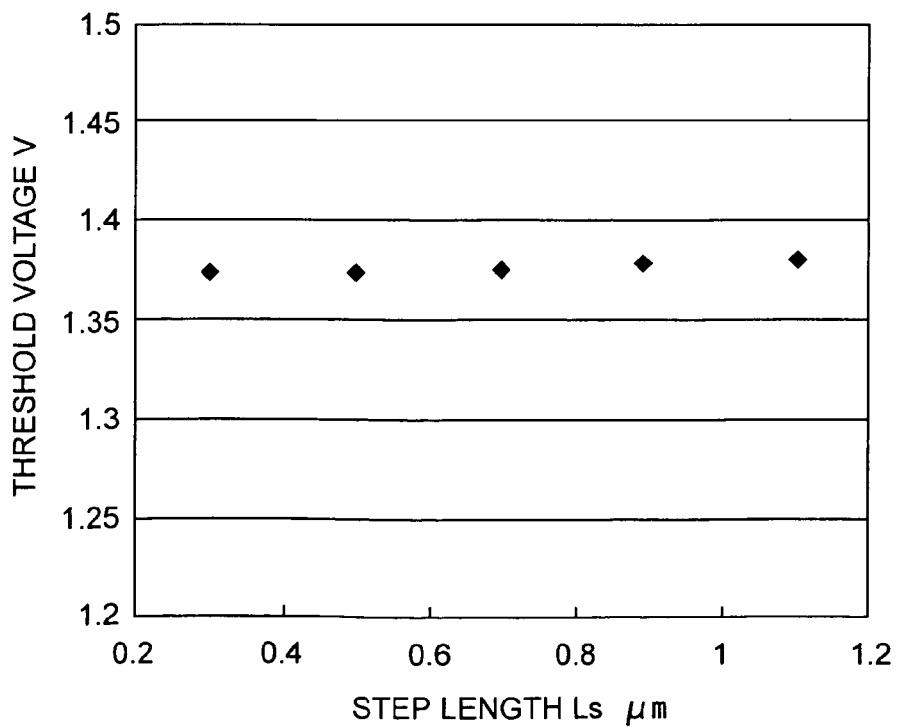
FIG. 7 is a graph showing the dependence of a threshold voltage of the resurf LDMOS of the embodiment on a step length.

FIGS. 5 through 7 respectively show results of actual measurements of a breakdown voltage, ON resistance and a threshold voltage where the step length Ls of the thick second gate insulating film 17 that contributes to the relaxation of the electric field concentration is varied by changing the forming region of the resist mask 25 from the end A of the local insulating layer 7 at the process step P3.

Incidentally, the on-implantation offset length Lt at the formation of the P low-concentration implantation layer 14a at the process step P2 is 0.5 µm and is the same in all cases, and the offset length Lo of the P drift diffusion layer 14 is 0.9 µm (0.4 µm oversize is a result of simulation calculation) and is the same in all cases.

In order to ensure 20V or higher corresponding to the target breakdown voltage of the resurf LDMOS 1 according to the present embodiment, there is a need to set the step length Ls to 0.3 µm or more as shown in FIG. 5.

In order to ensure the target ON resistance 80 mΩmm$^2$ or less, there is a need to set the step length Ls to 1.1 µm or less as shown in FIG. 6.

Thus, it is desirable that in order to make compatible between the target values of the breakdown voltage and the ON current in a state of the threshold voltage being kept in a predetermined voltage range as shown in FIG. 7, the range of the step length Ls is set to a range from 0.3 µm or more to 1.1 µm or less.

This is because if the step length Ls is set to less than 0.3 µm, then the breakdown voltage becomes lower than 20V and if the step length Ls exceeds 1.1 µm, then the ON resistance exceeds 80 mΩmm$^2$, thus causing both to deviate from a practical range.

If the length ΔL corresponding to a difference obtained by subtracting the step length Ls from the offset length Lo is set to a range from −0.2 µm or more obtained by subtracting the upper or lower limits of these step lengths Ls to 0.6 µm or less, then the above practical range can be ensured.

Incidentally, the above length ΔL of difference contains a negative range, i.e., the step length Ls longer than the offset length Lo. While the thick second gate insulating film 17 is supposed to cover over the N-type silicon substrate 2 formed with the channel, the threshold voltage is kept stable even in the case of the upper limit 1.1 µm (it is assumed that the end of the N body diffusion layer 15 located in a position spaced about 1 µm from the end A of the local insulating layer 7 is covered with 0.1 µm or so) of the step length Ls as shown in FIG. 7, and no influence is exerted on the practical operation.

It is considered that the threshold voltage is mainly controlled by the N body diffusion layer higher in impurity concentration than the N-type silicon substrate 2.

It is desirable that in order to stepwise disperse the electric field concentration developed in the point of change in shape and relax the concentration of the electric field, the thickness of the second gate insluting film 17 is set to a range from 30% or more to 70% or less of a thickness obtained by subtracting the thickness of the first gate insulating film 16 from one-half of the thickness of the local insulating layer 7 prior to the formation of the interlayer insulating film 20.

In the present embodiment, the thickness of the local insluting layer 7 prior to the formation of the interlayer insulating film 20 is reduced from 450 nm to 230 nm as a result of an increase and decrease by etching and thermal oxidation at the respective process steps. Therefore, the thickness of the second gate insluting film 17 is formed to 50 nm corresponding to 50% of 100 nm obtained by subtracting the thickness 15 nm of the first gate insulating film 16 from 230/2=150 nm.

As described above, the present embodiment provides a resurf LDMOS which includes a local insulating layer formed in an N-type silicon substrate in which an N-type impurity is diffused in a low concentration, and drain and source layers formed in the N-type silicon substrate lying in a region adjacent to one side of the local insulating layer by diffusing a P-type impurity of a type opposite to an N type in a high concentration. A P drift diffusion layer is formed by diffusing, in a low concentration, the P-type impurity into the N-type silicon substrate lying below the drain layer and the N-type silicon substrate lying in a region hidden under the local insulating layer and extended to the source layer side. A second gate insulating film connected to a thin first gate insulating film and thicker than the first gate insulating film is formed in a region lying on the P drift diffusion layer adjacent to the source layer side of the local insluting layer. Thus, a stepwise point of change in shape can be formed at a portion on the P drift diffusion layer where the first gate insulating film and the second gate insulating film are connected. A higher breakdown voltage can be ensured by dispersing the concentration of an electric field developed in the point of change in shape stepwise and relaxing the concentration of an electric field developed in the point of change in the shape of the end on the source side, of the local insulating layer, thus making it possible to realize a practicable resurf LDMOS capable of obtaining a predetermined ON resistance at a predetermined breakdown voltage.

The range of the step length Ls of the second gate insulating film is set to the range from 0.3µor more to 1.1 µm or less, and the length ΔL of the difference obtained by subtracting the step length Ls from the offset length Lo of the P drift diffusion layer is set to the range from −0.2 µm or more to 0.6 µm or less. Thus, a more practicable resurf LDMOS can be realized which makes compatible between the predetermined breakdown voltage and the predetermined ON resistance in a state in which a threshold voltage is kept in a predetermined voltage range.

Incidentally, although the above embodiment has described that the second gate insulating film is formed for its exclusive use, a high breakdown voltage MOSFET (MOS Field Effect Transistor) 30 shown in FIG. 8 may be configured in the following manner where it is formed in the same N-type silicon substrate simultaneously.

Figure 8:
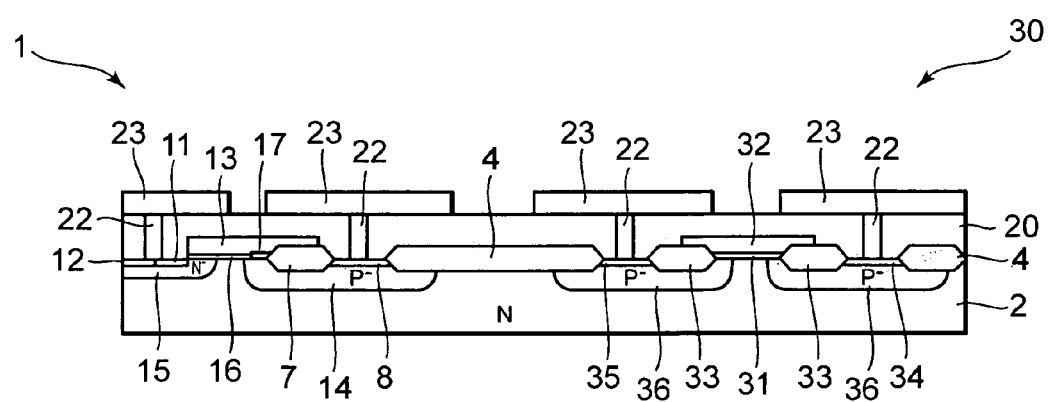
FIG. 8 is an explanatory diagram illustrating a state of mixing of the resurf LDMOS of the embodiment with a high breakdown voltage MOSFET.

The high breakdown voltage MOSFET 30 shown in FIG. 8 is formed in the N-type silicon substrate 2 insulated and separated from a device forming area 3 of a resurf LDMOS 1 by device isolation layers 4. The high breakdown voltage MOSFET 30 includes a thick gate insulating film 31 formed in a manner similar to the second gate insulating film 17, a gate electrode 32 disposed opposite to the N-type silicon substrate 2 via the thick gate insulating film 31 and formed in a manner similar to the gate electrode 13, local insulating layers 33 formed on both sides of the gate electrode 32 in a manner similar to the local insulating layer 7, a drain layer 34 and a source layer 35 formed in the N-type silicon substrate 2 on the sides opposite to the gate electrode 32, of the local insulating layers 33 in a manner similar to the drain layer 8 and the source layer 11 respectively, P drift diffusion layers 36 formed in the N-type silicon substrate 2 located below the drain layer 34 and the source layer 35 in a manner similar to the P drift diffusion layer 14, etc. The N-type silicon substrate 2 disposed below the gate electrode 32 interposed between the P drift diffusion layers 36 located below the drain layer. 34 and the source layer 35 is configured so as to function as a channel region of the high breakdown voltage MOSFET 30.

If the second gate insulating film 17 is formed with the same thickness upon formation of the thick gate insulating film 32 of the high breakdown voltage MOSFET 30, then the simplification of a process for manufacturing a semiconductor device in which the resurf LDMOS 1 and the high breakdown voltage MOSFET 30 are mixed together can be achieved.

Although the above embodiment has explained the P-type resurf LDMOS by way example, an N-type resurf LDMOS in which the polarity of the N type of the gate electrode is used as it is and the polarities of the respective diffusion layers containing the silicon substrate are set in reverse, is also applied in like manner.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
   a semiconductor layer with an impurity of a first conductivity type diffused therein;
   a local insulating layer formed in the semiconductor layer;
   a drain layer formed in the semiconductor layer located on one side of the local insulating layer with an impurity of a second conductivity type opposite to the first conductivity type being diffused therein;
   a source layer formed in the semiconductor layer separated from the other side of the local insulating layer with the second conductivity type impurity being diffused therein;
   a gate electrode formed over the semiconductor layer extending from over the local insulating layer to the source layer;
   a low-concentration diffusion layer formed in the semiconductor layer located below the drain layer, the local insulating layer and the gate electrode with the second conductivity type impurity being diffused therein in a concentration lower than the drain layer;
   a first gate insulating film formed between the gate electrode and the semiconductor layer and extending from an end on the source layer side, of the gate electrode to the local insulating layer without reaching the local insulating layer;
   a second gate insulating film formed between the gate electrode and the semiconductor layer and extending from an end on the other side of the local insulating layer to the first gate insulating film, said second gate insulating film being connected to the first gate insulating film and being thicker than the first gate insulating film and thinner than one-half of the thickness of the local insulating layer;
   a pullout layer formed on a surface of the semiconductor layer adjacent to the source layer, with a high concentration of the first conductivity type impurity; and
   a body diffusion layer formed in the semiconductor layer, the body diffusion layer being spaced away from the low-concentration diffusion layer, surrounding the source layer and the pullout layer, and having a concentration of the first conductivity type impurity higher than that of the semiconductor layer and lower than that of the pullout layer.

2. The semiconductor device according to claim 1, wherein when the distance between the end on the source layer side corresponding to the other side of the local insulating layer and an end on the source layer side, of the second gate insulating film is assumed to be a step length Ls, and the distance between the end on the source layer side, of the local insulating layer and an end on the source layer side, of the low-concentration diffusion layer is assumed to be an offset length Lo, the step length Ls ranges from 0.3 μm or more to 1.1 μm or less, and a length ΔL of a difference obtained by subtracting the step length Ls from the offset length Lo ranges from −0.2 μm or more to 0.6 μm or less.

3. The semiconductor device according to claim 1, wherein the thickness of the second gate insulating film ranges from 30% or more to 70% or less of a thickness obtained by subtracting the thickness of the first gate insulating film from one-half of the thickness of the local insulating layer.

4. The semiconductor device of claim 1, further comprising:
   a device forming area with the drain layer, the source layer, the gate electrode, and the first and second gate insulating films formed therein; and
   a device isolating area surrounding a periphery of the device forming area.

5. The semiconductor device of claim 4, further comprising a device isolation layer formed in the device isolating area for electrically insulating and isolating the device forming area.

6. The semiconductor device of claim 1, further comprising an insulating film formed on the source layer, the drain layer, the gate electrode, and the local insulating layer.

7. The semiconductor device of claim 6, further comprising a conductive plug formed of a conductive material and penetrating the insulating film.

8. The semiconductor device of claim 7, wherein the conductive plug reaches one of the drain layer and a boundary portion between the source layer and pullout layer.

9. The semiconductor device of claim 7, wherein the conductive material is one of tungsten (W), aluminum (Al) and the like.

10. The semiconductor device of claim 6, further comprising a metal wiring formed on the insulating film.

* * * * *